United States Patent
Raval et al.

(10) Patent No.: US 7,365,848 B2
(45) Date of Patent: Apr. 29, 2008

(54) SYSTEM AND METHOD USING VISIBLE AND INFRARED LIGHT TO ALIGN AND MEASURE ALIGNMENT PATTERNS ON MULTIPLE LAYERS

(75) Inventors: Pankaj Raval, Fairfield, CT (US); Walter H. Augustyn, deceased, late of Monroe, CT (US); by Dolores Augustyn, legal representative, Monroe, CT (US); Lev Ryzhikov, Norwalk, CT (US)

(73) Assignee: ASML Holding N.V. (NL)

( * ) Notice: Subject to any disclaimer, the term of this patent is extended or adjusted under 35 U.S.C. 154(b) by 332 days.

(21) Appl. No.: 11/272,711

(22) Filed: Nov. 15, 2005

(65) Prior Publication Data

US 2006/0115956 A1 Jun. 1, 2006

Related U.S. Application Data

(60) Provisional application No. 60/631,991, filed on Dec. 1, 2004.

(51) Int. Cl.
*G01B 11/00* (2006.01)
(52) U.S. Cl. .................... 356/401; 356/400; 355/53; 430/22
(58) Field of Classification Search ........ 356/399–401; 355/53, 72, 75, 67
See application file for complete search history.

(56) References Cited

U.S. PATENT DOCUMENTS

| | | | |
|---|---|---|---|
| 4,068,947 A | 1/1978 | Buckley et al. | |
| 4,650,315 A | 3/1987 | Markle | |
| 4,711,535 A | 12/1987 | Shafer | |
| 4,747,678 A | 5/1988 | Shafer et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |

(Continued)

FOREIGN PATENT DOCUMENTS

WO WO 98/33096 7/1998

(Continued)

*Primary Examiner*—Layla G. Lauchman
(74) *Attorney, Agent, or Firm*—Sterne, Kessler Goldstein & Fox PLLC (57) ABSTRACT

A system and method are used to increase alignment accuracy of feature patterns through detection of alignment patterns on both a surface layer and at least one below surface layers of an object. Visible light is used to detect alignment patterns on the surface layer and infrared light is used to detect patterns one layers below the surface. For example, reflected visible light and transmitted infrared light are co-focused onto detector after impinging on respective alignment patterns. The co-focused light is then used to determine proper alignment of the object for subsequent pattern features. This substantially increases accuracy of alignment of pattern features between layers, as compared to conventional systems.

18 Claims, 8 Drawing Sheets

U.S. PATENT DOCUMENTS

| | | |
|---|---|---|
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,095,483 B2 * | 8/2006 | Daniel et al. .................. 355/53 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0176174 A1 * | 8/2005 | Leedy ........................ 438/107 |

FOREIGN PATENT DOCUMENTS

| | | |
|---|---|---|
| WO | WO 98/38597 | 9/1998 |

* cited by examiner

SYSTEM AND METHOD USING VISIBLE AND INFRARED LIGHT TO ALIGN AND MEASURE ALIGNMENT PATTERNS ON MULTIPLE LAYERS

CROSS REFERENCE TO RELATED APPLICATIONS

This application claims benefit under 35 U.S.C. §119(e) to U.S. Provisional Application Ser. No. 60/631,991, filed Dec. 1, 2004, which is incorporated by reference herein in its entirety.

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

As discussed above, a lithographic apparatus uses a patterning device to pattern incoming light. A static patterning device can include reticles or masks. A dynamic patterning device can include an array of individually controllable elements that generate a pattern through receipt of analog or digital signals.

Multiple layers can be formed on each substrate, with each layer receiving feature patterns that interconnect within that layer and to other feature patterns in previous/subsequent layers. However, typically only an alignment patterned formed on a top layer of the substrate is used to determine proper alignment of feature patterns with respect to each other. With tolerances getting smaller, it would be desirable for alignment of subsequent feature patterns to utilize alignment patterns on the top layer and one or more previously formed layers.

Therefore, what is needed is a system and method that allow for measurement or detection of alignment patterns on a top layer and one or more previously formed layers before forming a next feature pattern.

SUMMARY

According to one embodiment of the present invention, a system comprises an alignment system, an object, and a focusing system. The alignment system includes an illumination portion and a detector. The illumination portion produces at least visible and infrared light. The object comprises a surface layer including a first feature pattern and a first alignment pattern, a support layer, and a second layer. The second layer is one of the surface layer or the support layer. The second layer includes a second feature pattern and a second alignment pattern. The focusing system co-focuses onto the detector the visible and infrared light after each has impinged on the first and second alignment patterns. The object is aligned to receive subsequent feature patterns based on the detection of the first and second alignment patterns.

According to one embodiment of the present invention, there is provided a method comprising the following steps. Generating at least visible light and infrared light. Reflecting the visible light from a first alignment pattern on a surface layer of an object. Focusing the reflected visible light onto a detector. Transmitting or reflecting the infrared light through a second alignment pattern on a second layer of the object, the second layer of the object being below the first layer of the object. Focusing the transmitted or reflected infrared light onto the detector. Generating an alignment signal based on the detected first and second alignment patterns. Aligning the object to receive a subsequent section of a feature pattern based on the generating step.

Further embodiments and features of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview

Although specific reference may be made in this text to the use of a patterning device in a lithographic system that patterns a substrate, it should be understood that the patterning device described herein may have other applications, such as in a projector or a projection system to pattern an object or display device (e.g., in a projection television system, or the like). Therefore, the use of the lithographic system and/or substrate throughout this description is only to describe example embodiments of the present invention.

Embodiments of the present invention provide a system and method that are used for alignment of feature patterns through detection of alignment patterns on both a surface layer and at least one below (e.g., buried) surface layers of an object. Visible light is used to detect alignment patterns on the surface layer and infrared light is used to detect patterns one layers below the surface. In this example, the object is made from a material through which infrared light is transmitted and/or reflected and off of which visible light is reflected. For example, the object can be made from silicon. Thus, reflected visible light and transmitted or reflected infrared light are co-focused onto a detector. The co-focused light is then used to determine proper alignment of the object for subsequent pattern features. This makes it possible to align pattern features between two layers of alignment patterns or featured patterns when one of them is buried deeply and cannot be aligned by conventional alignment systems.

In one example, co-focusing is meant to describe when both the visible and infrared light has a same focal length between a focusing system and the detector. In one example, this can be accomplished through use of an optical system. In another example, this can be accomplished through use of an optical system in conjunction with a positioning system that moves either the object and/or the detector relative (e.g., towards/away) to the optical system.

In one example of this description, visible light is within a range of about 540-600 nm, near infrared light is within a range of about 650-1000 nm, and infrared light is within a wavelength of about 1000-3500 nm, while 650-3500 are all referred to as infrared light.

Terminology

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed above and below.

A programmable mirror array may comprise a matrix-addressable surface having a viscoelastic (i.e., a surface having appreciable and conjoint viscous and elastic properties) control layer and a reflective surface. The basic principle behind such an apparatus is that, for example, addressed areas of the reflective surface reflect incident light as diffracted light, whereas unaddressed areas reflect incident light as undiffracted light. The addressing can be binary or through multiple intermittent angles. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light. This is sometimes referred to as a grating light valve.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In one example, groups of the mirrors can be coordinated together to be addresses as a single "pixel." In this example, an optical element in an illumination system can form beams of light, such that each beam falls on a respective group of mirrors.

In both of the situations described here above, the array of individually controllable elements can comprise one or more programmable mirror arrays.

A programmable LCD array can also be used.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

In the lithography environment, the term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the patterning device and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Environment for a Patterning Device

Although the patterning device of the present invention can be used in many different environments, as discussed above, a lithographic environment will be used in the description below. This is for illustrative purposes only.

A lithographic apparatus is a machine that applies a desired pattern onto a target portion of an object. The lithographic apparatus can be used, for example, to pattern an object in a biotechnology environment, in the manufacture of ICs, flat panel displays, micro or nano fluidic devices, and other devices involving fine structures. In an IC-based lithographic environment, the patterning device is used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). As discussed above, instead of a mask, in maskless IC lithography the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction. These concepts will be discussed in more detail below.

Figure 1:
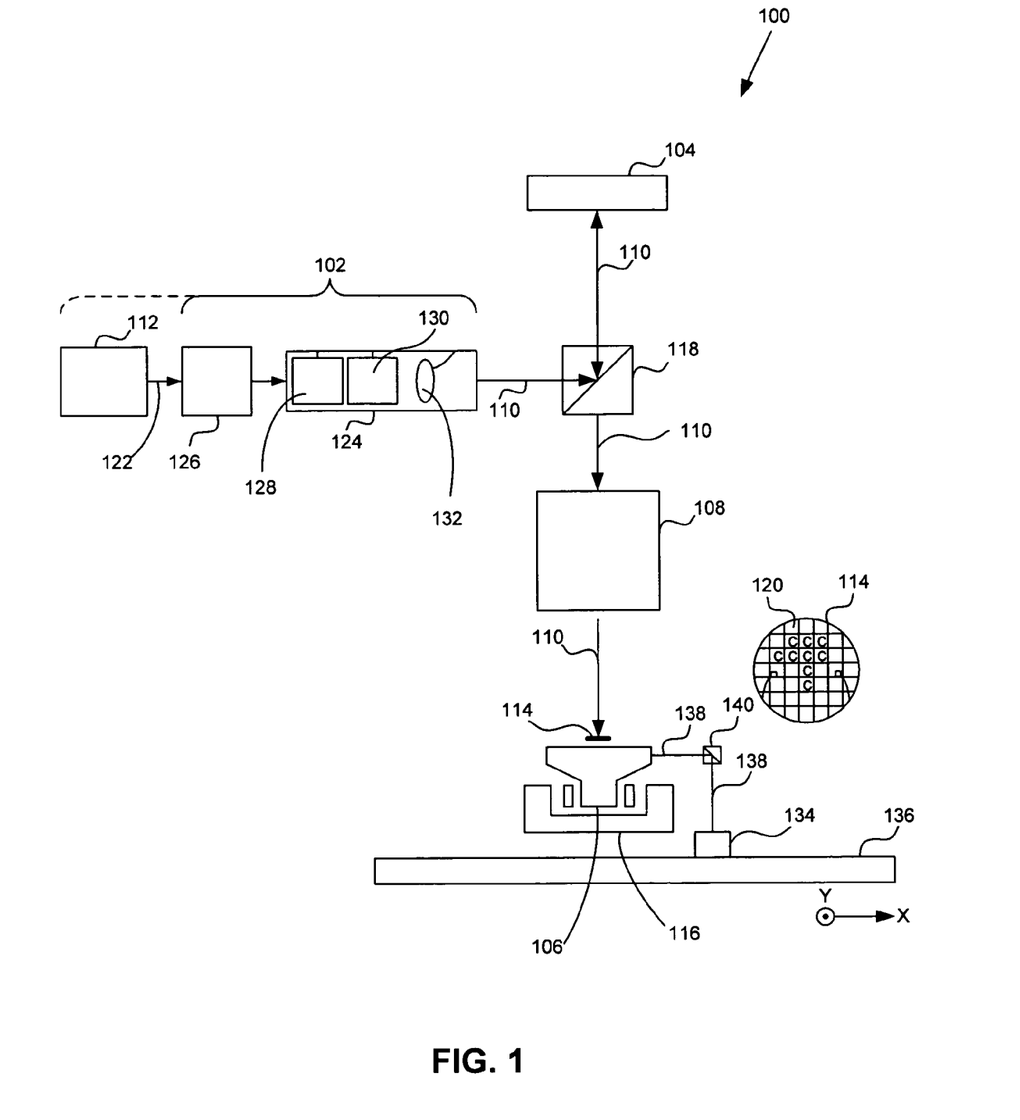
FIG. 1 depicts a lithographic apparatus, according to one embodiment of the invention.

FIG. 1 schematically depicts a lithographic projection apparatus 100, according to one embodiment of the invention. Apparatus 100 includes at least a radiation system 102, a patterning device 104 (e.g., a static device or an array of individually controllable elements), an object table 106 (e.g., a substrate table), and a projection system ("lens") 108.

Radiation system 102 is used to supply a beam 110 of radiation, which in this example also comprises a radiation source 112.

Array of individually controllable elements 104 (e.g., a programmable mirror array) is used to pattern beam 110. In one example, the position of the array of individually controllable elements 104 is fixed relative to projection system 108. However, in another example, array of individually controllable elements 104 is connected to a positioning device (not shown) that positions it with respect to projection system 108. In the example shown, each element in the array of individually controllable elements 104 are of a reflective type (e.g., have a reflective array of individually controllable elements).

Object table 106 is provided with an object holder (not specifically shown) for holding an object 114 (e.g., a resist coated silicon wafer, a glass substrate, or the like). In one example, substrate table 106 is connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) is used to project the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser, or the like) produces a beam of radiation 122. Beam 122 is fed into an illumination system (illuminator) 124, either directly or after having traversed conditioning device 126, such as a beam expander 126, for example. Illuminator 124 can comprise an adjusting device 128 that sets the outer and/or inner radial extent (commonly referred to as σ-outer and σ-inner, respectively) of the intensity distribution in beam 122. In addition, illuminator 124 can include various other components, such as an integrator 130 and a condenser 132. In this way, beam 110 impinging on the array of individually controllable elements 104 has a desired uniformity and intensity distribution in its cross-section.

In one example, source 112 is within the housing of lithographic projection apparatus 100 (as is often the case when source 112 is a mercury lamp, for example). In another example, source 112 is remotely located with respect to lithographic projection apparatus 100. In this latter example, radiation beam 122 is directed into apparatus 100 (e.g., with the aid of suitable directing mirrors (not shown). This latter scenario is often the case when source 112 is an excimer laser. It is to be appreciated that both of these scenarios are contemplated within the scope of the present invention.

Beam 110 subsequently interacts with the array of individually controllable elements 104 after being directed using beam splitter 118. In the example shown, having been reflected by the array of individually controllable elements 104, beam 110 passes through projection system 108, which focuses beam 110 onto a target portion 120 of substrate 114.

With the aid of positioning device 116, and optionally interferometric measuring device 134 on a base plate 136 that receives interferometric beams 138 via beam splitter 140, substrate table 106 is moved accurately, so as to position different target portions 120 in a path of beam 110.

In one example, a positioning device (not shown) for the array of individually controllable elements 104 can be used to accurately correct the position of the array of individually controllable elements 104 with respect to the path of beam 110, e.g., during a scan.

In one example, movement of substrate table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 may alternatively/additionally be moveable, while substrate table 106 and/or the array of individually controllable elements 104 may have a fixed position to provide the required relative movement.

In another example, substrate table 106 may be fixed, with substrate 114 being moveable over substrate table 106. Where this is done, substrate table 106 is provided with a multitude of openings on a flat uppermost surface. A gas is fed through the openings to provide a gas cushion, which supports substrate 114. This is referred to as an air bearing arrangement. Substrate 114 is moved over substrate table 106 using one or more actuators (not shown), which accurately position substrate 114 with respect to the path of beam 110. In another example, substrate 114 is moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography, and for other applications.

The depicted apparatus 100 can be used in at least one of four modes:

1. Step mode: the entire pattern on the array of individually controllable elements 104 is projected during a single exposure (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 moves in a given direction (e.g., a "scan direction," for example, the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary, and the entire pattern is projected onto a target portion 120 of substrate 114 using pulsed radiation system 102. Substrate table 106 is moved with an essentially constant speed, such that patterned beam 110 scans a line across substrate 106. The pattern on the array of individually controllable elements 104 is updated as required between pulses of radiation system 102, and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary Alignment System

Figure 2:
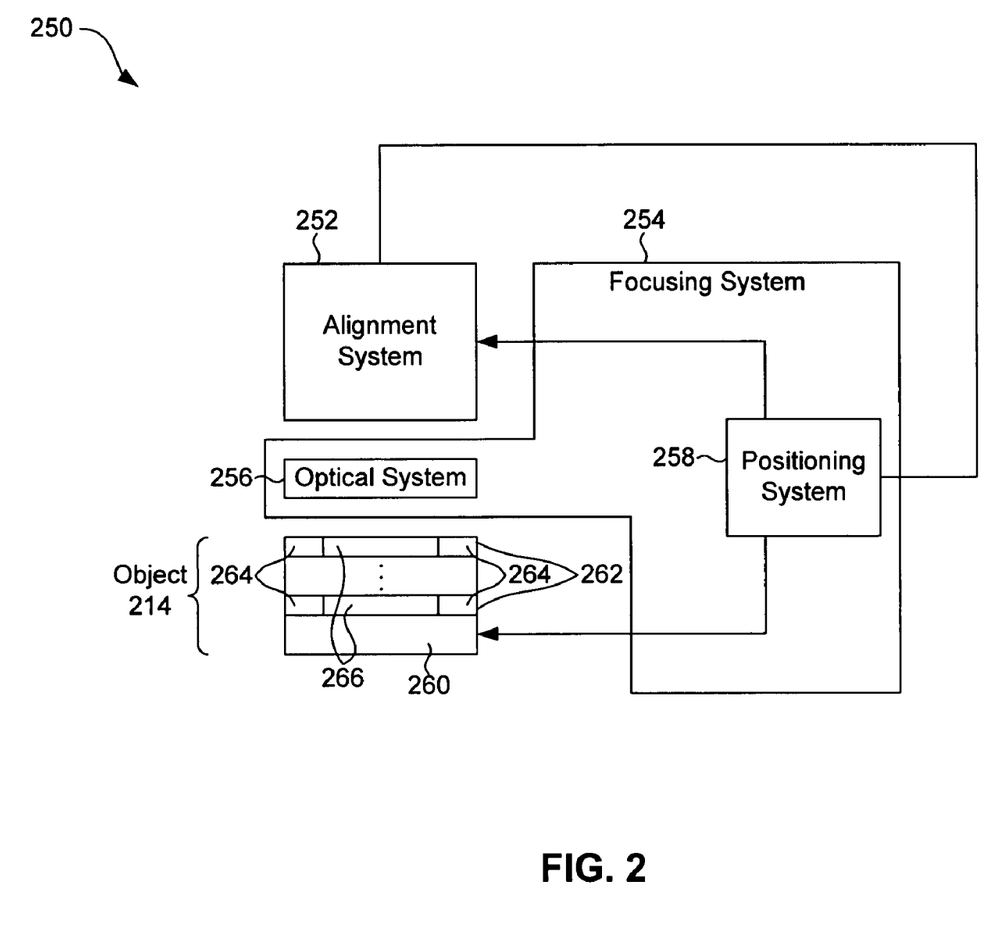
FIGS. 2 and 3 show alignment systems, according to various embodiments of the present invention.
Figure 3:
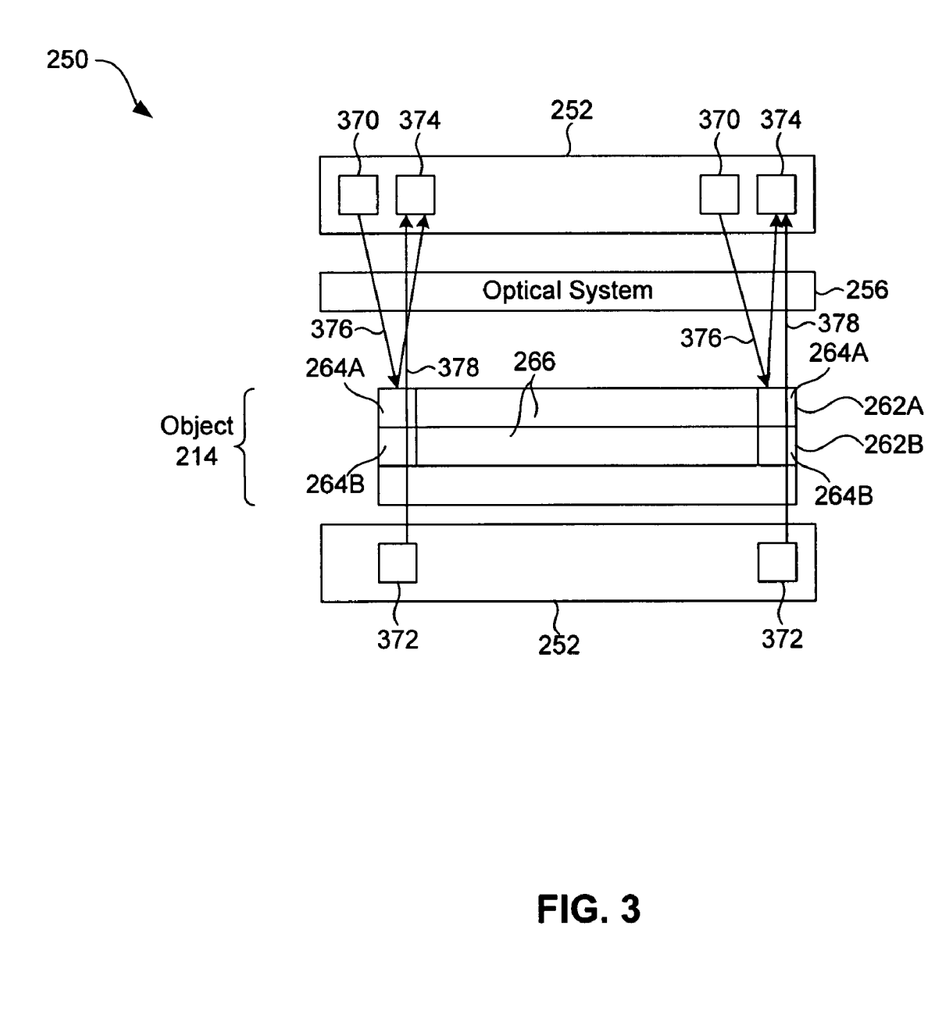

FIGS. 2 and 3 show alignment and focusing portions 250 and 350, according to various embodiments of the present invention. Alignment and focusing portions 250 or 350 can be used additionally or alternatively to those portions discussed above as performing similar operations in lithography tool 100. Through use of these portions 250 or 350, both surface layer and intermediate layer (e.g., up to about 150 μm deep) alignment patterns can be detected and utilized in aligning an object for subsequent feature pattern formation, as is discussed in more detail below. In one example, the object comprises material that allows infrared light to be transmitted and visible light to be reflected. For example, the object can be made from a silicon material, such as a semiconductor wafer, a flat panel display substrate, or any material that allows transmission of IR light.

Alignment and focusing portion 250 comprises alignment system 252 and focusing system 254. Focusing system 254 is coupled to an object 214 and alignment system 252. In one embodiment, focusing system 254 includes an optical system 256. In another embodiment, focusing system 254 includes optical system 256 and a positioning system 258. In this latter embodiment, positioning system 258 is coupled to one or both of object 214 and alignment system 252 to move one or both relative to optical system 256, i.e., towards or away from optical system 256. This is done to allow for fine tuning of co-focusing of visible and infrared light, as discussed in more detail below.

In one example, object 214 includes a support layer 260 and one or more layers 262 (e.g., surface and intermediate layers), which include areas for alignment patterns 264 and feature patterns 266. In another example, alignment patterns can be located on a back surface of object 214.

Turning now to FIG. 3, alignment system 252 in alignment and focusing portion 350 includes one or more light sources 370 (e.g. for visible light detection), one or more light sources 372 (e.g., for IR light detection), and one or more detectors 374. Each detector detects both visible and infrared light. For example, detectors 374 can be one or more cameras, CCD sensors, CMOS sensors, or the like. It is to be appreciated a number of light sources 370/372 and detectors 374 can correlate, or a single detector 374 and multiple light sources 370/372, or vice versa, can be used. Also, as stated above, the light source can either be placed in front of or behind the object 214 to allow for either transmitted or reflected IR light. All permutations and variations are contemplated within the scope of the present invention.

In the example shown in FIG. 3, object 214 includes a surface layer 262A and an intermediate layer 262B. Each layer 262A and 262B includes one or more respective alignment patterns 264A and 264B and respective feature patterns 266A and 266B.

In one example, visible light 376 from one or more visible light sources 370 is reflected from one or more alignment patterns 264A on surface layer 262A and infrared light 378 from one or more infrared light sources 372 is transmitted through one or more alignment patterns 264B on intermediate layer 262B or alignment pattern 264B on backside of object 214. Optical system 256 co-focuses the reflected visible light 376 and the transmitted infrared light 378 onto a respective detector 374. Each respective detector 374 generates a measured signal from the detected visible light 376 and infrared light 378. The measured signal generated by detectors 374 are used to align object 214 for subsequent feature pattern formation.

In one example, positioning system 258 is used to allow for co-focusing or further adjust or fine adjust a focal position or focal length between optical system 256 and detector 374 of visible light 376 and/or infrared light 378, such that both wavelengths of light are co-focused onto detector 374 within a desired tolerance.

Thus, in alignment and focusing portion 350, both alignment patterns 264A and 264B are used in order to determine feature pattern positions on both of layers 262A and 262B. This dual-detection operation increases alignment accuracy compared to only being able to detect an alignment pattern on a surface layer of an object in conventional devices.

One exemplary environment for one or more embodiments of the present invention is in a Micralign lithography tool manufactured by ASML of Veldhoven, The Netherlands. Example aspects of the Micralign lithography tool can be found in U.S. Pat. Nos. 4,068,947, 4,650,315, 4,711,535, and 4,747,678, which are all incorporated by reference herein in their entireties.

Figure 4:
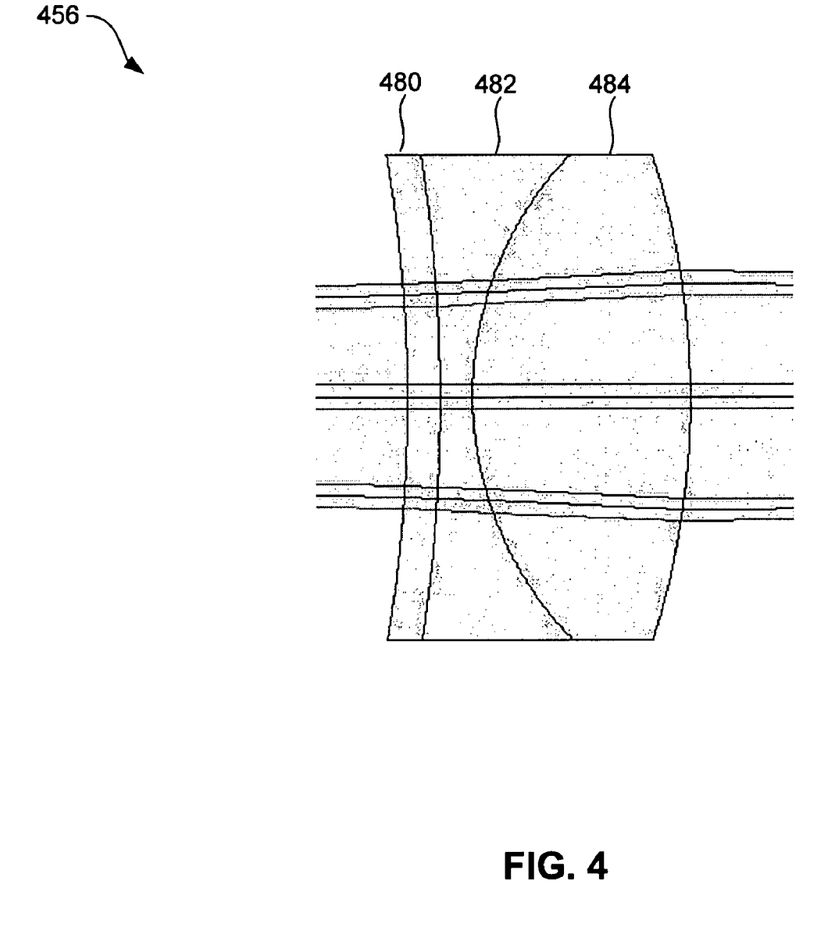
FIGS. 4 and 5 show two optical devices that can be used in conjunction with each other in the alignment system of FIGS. 2 and 3, according to one embodiment of the present invention.
Figure 5:
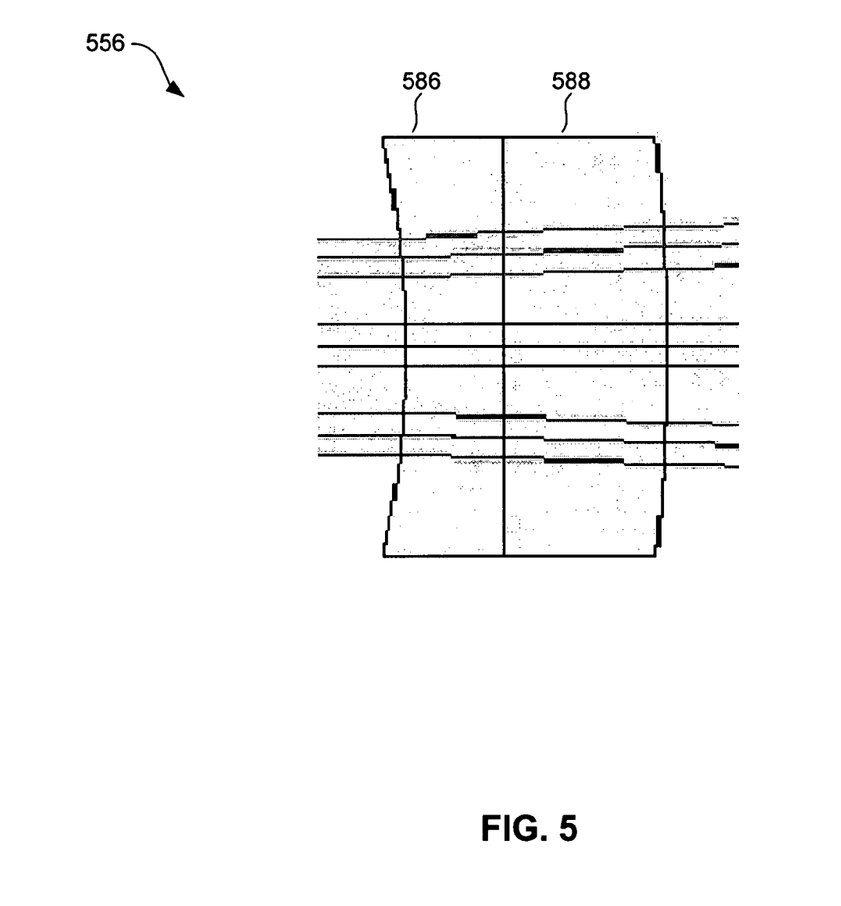

FIGS. 4 and 5 show two optical devices 456 and 556 that can be used in conjunction with each other in optical system 256, according to one embodiment of the present invention.

With reference to FIG. 4, optical device 456 includes first, second, and third lenses 480, 482, and 484. The triplet lens design provides an optical prescription that allows focusing of visible and IR wavelengths onto a same plane together.

In one example, lenses 480, 482, and 484 have the following characteristics, whose parameters can actually be more or less than shown depending on desired tolerances:

First lens 480 comprises R1=−64 to −65 mm, R2 =−71 to −72 mm, thickness=1.5 to 1.6 mm, diameter, =22.0 mm, and a glass type is SF10 (Schott);

Second lens 482 comprises R1=−71 to −72 mm, R2=15 to 16 mm, thickness=1 to 2 mm, diameter=22.0 mm, and a glass type is N-PSK3 (Schott); and Third lens 484 comprises R1=15 to 16 mm, R2=−35 to −36 mm, thickness=10 to 11 mm, diameter=22.0 mm, and a glass type is N-PK51 (Schott).

In another example, lenses 480, 482, and 484 have the following characteristics, whose parameters can actually be more or less than shown depending on desired tolerances:

First Lens 480: R1=−64.795 mm, R2=−71.120 mm, thickness=1.518 mm, diameter, =22.0 mm. Glass type is SF10 (Schott)

Second Lens 482: R1=−71.120 mm, R2=15.469 mm, thickness=1.5 mm., diameter=22.0 mm. Glass type is N-PSK3 (Schott)

Third Lens 484: R1=15.469 mm, R2=−35.382 mm, thickness=10.083 mm, diameter=22.0 mm Glass type is N-PK51 (Schott)

With reference to FIG. 5, optical device 556 includes first and second lenses 586 and 588. The doublet lens design provides an optical prescription that allows focusing of visible and IR wavelengths onto a same plane together.

In one example, lenses 586 and 588 have the following characteristics, whose parameters can actually be more or less than shown depending on desired tolerances:

First lens 586 comprises R1=−26 to −27 mm, R2=infinity, thickness=3 mm, diameter=12 to 13 mm, and a glass type is BK7 (Schott);

Second lens 588 comprises R1=infinity, R2=−59 to −60 mm, thickness=5 mm, diameter=12 to 13 mm, and a glass type is F2 (Schott).

In another example, lenses 586 and 588 have the following characteristics, whose parameters can actually be more or less than shown depending on desired tolerances:

First Lens 586: R1=−26.697 mm, R2=infinity, thickness=3 mm, diameter=12.7 mm Glass type is BK7 (Schott)

Second Lens 588: R1=infinity, R2=−59.03 mm, thickness=5 mm, diameter=12.7 mm. Glass type is F2 (Schott).

Exemplary Optical Path

Figure 6A:
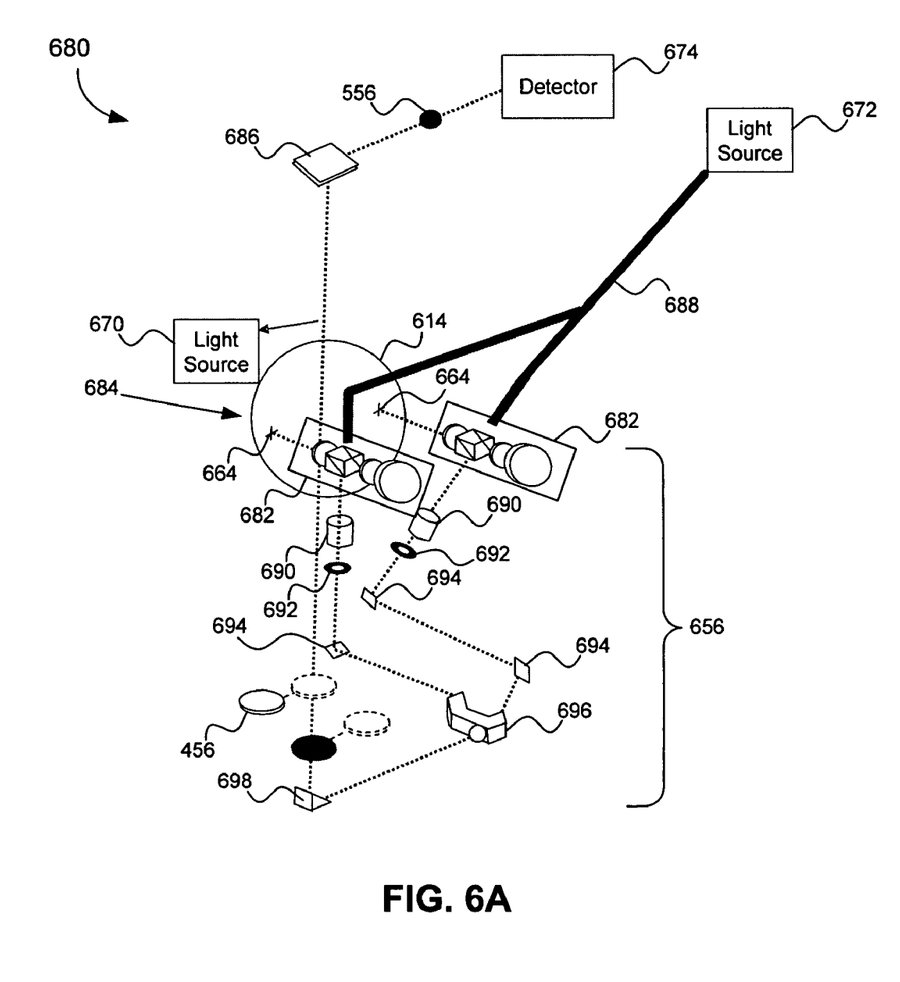
FIG. 6A shows an optical arrangement in a lithography system, according to one embodiment of the present invention.
Figure 6B:
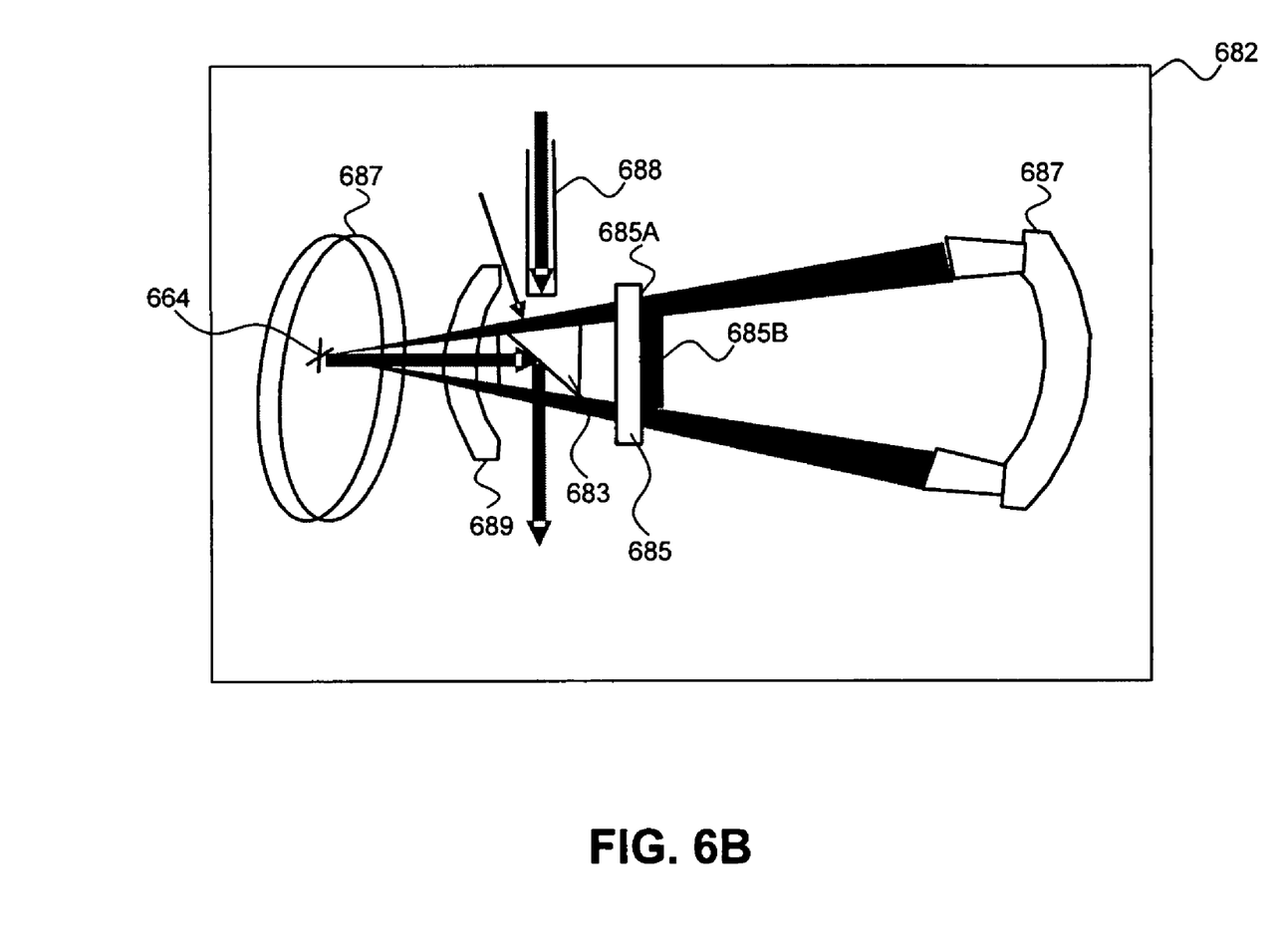
FIG. 6B shows an IR portion of the optical arrangement in FIG. 6A, according to one embodiment of the present invention.

FIG. 6A shows an optical arrangement 680 in a lithography system, according to one embodiment of the present invention. For example optical arrangement 680 can be found in system 100. FIG. 6B shows an optical system 682 of arrangement 680, according to one embodiment of the present invention.

With reference to FIG. 6A and with respect to visible light, visible light from a broadband light source 672 is directed to alignment marks 664 on a substrate 614. Light reflecting from alignment marks 664 is directed onto a detector 674 using an optic 686, for example a folding mirror or the like. Additionally or alternatively, another optic 556 can be placed between optic 686 and detector 674, for example a Barlow optic.

With reference to FIG. 6A and with respect to IR light, IR light from a light source 672 is directed (e.g., via a filter) through optical system 682, e.g., an IR optical system, via a waveguide or fiber optic device 688. The IR light directed from optical system 682 is reflected from alignment marks 664 and received back at optical system 682. The received reflected IR light is directed from optical system 682 through objective lenses 680 and F-stop/aperture 692 onto folding mirror 694. In some examples, multiple folding mirrors 694 can be used. Once reflected from folding mirror 694, IR light is received at a field splitting optic 696, e.g., a field splitting prism. From field splitting prism 696, the IR light travels via a reflecting optical device 698 and an optics system 456, which includes first and second lenses of different magnifying powers to reflecting optic 686. Depending on magnification need, light may travel through only one of the lenses. Then the light travels to reflecting optic 686. From reflecting optic 686, IR light is directed onto detector 674, in one example through optic 687.

With reference now to FIG. 6B, an exemplary arrangement of optical system 682 is shown. In this example, optical system 682 includes a beam splitter 683, a blocking device 685, an annular mirror 687, and a focusing optic 689, e.g. a focusing lens. Blocking device 685 has a transparent peripheral portion 685A and an opaque central portion 685B, at least with respect to IR light. IR light received from optical waveguide 688 is reflected from beam splitter 683 through transparent portion 685A of blocking device 685 to be reflected from annular mirror 687. After reflection, the IR light is transmitted back through transparent portion 685A of blocking device 685 and beam splitter 683 before being focused onto alignment areas 664 on substrate 614. After reflecting from alignment areas 664, the IR light is reflected from beam splitter 683 to travel as discussed above from optical system 682 to detector 674.

Exemplary Operation

Figure 7:
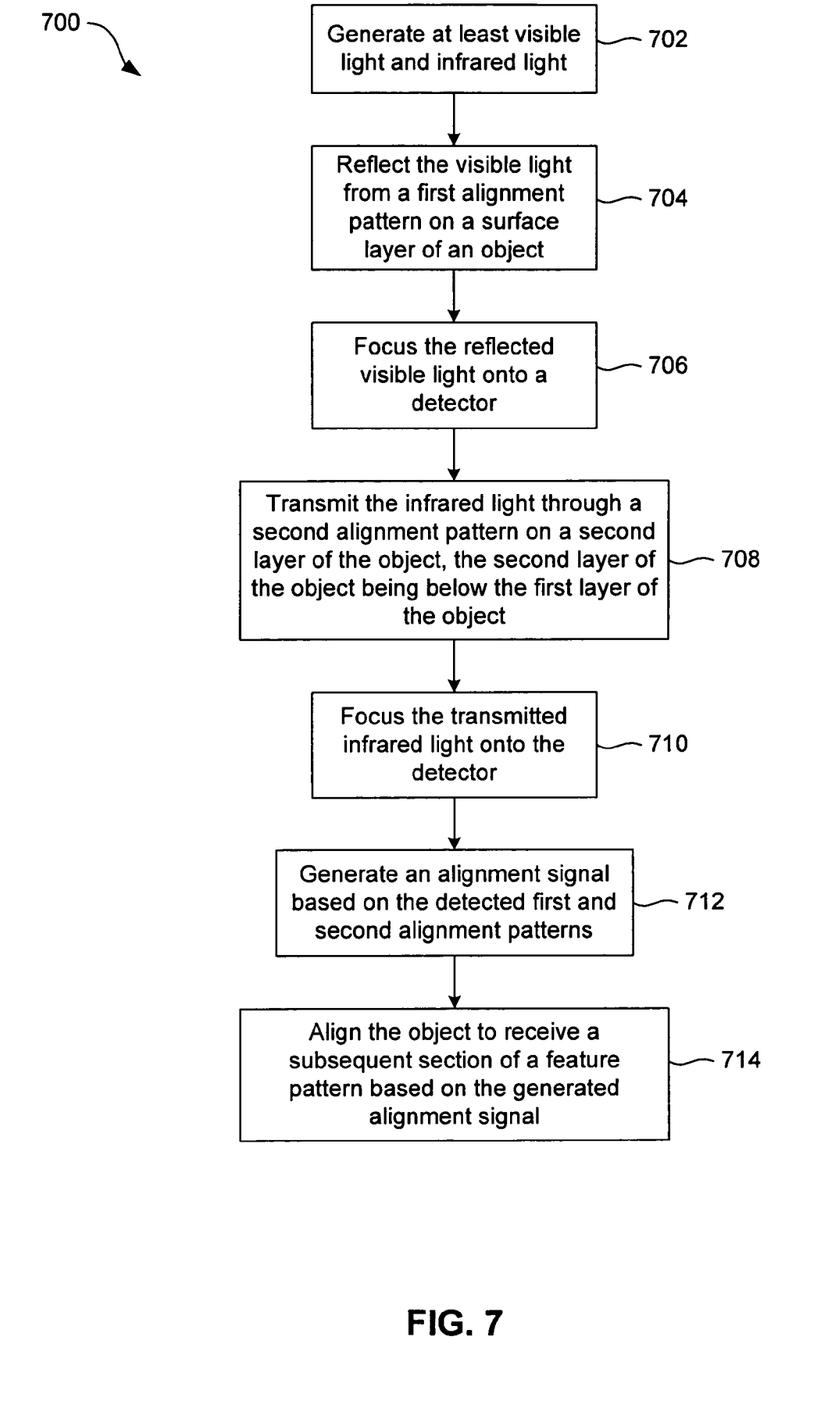
FIG. 7 shows a flowchart depicting a method, according to one embodiment of the present invention.

FIG. 7 shows a flowchart depicting a method 700, according to one embodiment of the present invention. In one example, method 700 is carried out using one or more of the devices and/or systems described above. In step 702, at least visible light and infrared light are generated. In step 704, the visible light is reflected from a first alignment pattern on a surface layer of an object. In step 706, the reflected visible light is focused onto a detector. In step 708, the infrared light is transmitted through a second alignment pattern on a second layer of the object, the second layer of the object being below the first layer of the object. In step 710, the transmitted infrared light is focused onto the detector. In step 712, an alignment signal is generated based on the detected first and second alignment patterns. In step 714, the object is aligned to receive a subsequent section of a feature pattern based on the generated alignment signal.

Exemplary Measured Alignment Patterns

Thus, according to one or more embodiments and/or examples of the present invention, discussed above, embedded wafer targets in IR or NIR (Near Infra Red) (hereinafter, NIR) and aligning mask targets in visible light spectrum are detectable substantially simultaneously or individually using one camera. In some examples, this can be done with two separate cameras. However, in this example additional optical components would be needed.

In a first example, this was accomplished by changing optical characteristics of specific optical element in the view path (e.g., element 456) in terms of its radii. This allows viewing of the target image in visible and near IR wavelength at the same focal position or within the available depth of focus.

In a second example, this can be achieved if a chuck that carries a substrate can be moved in a Z-direction. The focal position of the embedded alignment target is brought into a focal plane of the camera in IR first. This captures the image position information, which can be stored in memory, as would become apparent to one of ordinary skill in the art upon reading and understanding this invention. Then, the system retracts the chuck to its normal position, so that the aligning mask image (projected on top of the substrate plane) comes into the focal position of the camera, which X-Y location can be stored in memory. In a subsequent step, a fine alignment system can determine the offset between these two recorded image positions and determine necessary commands for alignment. This would substantially eliminate optical modifications in the viewing optics. However, it can require a control system of the machine that controls chuck movement in a z-direction to be modified.

While this second example allows IR alignment without any optical design changes, it can require additional parameters to be taken into consideration. First, the complete alignment sequence requires two distinct steps for collecting substrate and pattern generator target pattern position data. Thus, by moving the chuck twice for each substrate, an overall alignment time for alignment will be considerably larger then needed for the first example. Since the substrate is mounted on chuck that is set in best lithographic focus (in x, y and z direction) every time it is moved from that position, it is important to ensure that this best focus position is maintained or repeated for optimum lithographic performance.

In a third example, a same two step functionality can be achieved by moving a camera in the z-direction under electronically controlled motion. Then, at one time it will have an embedded substrate target in IR in focus with IR wavelength and the aligning pattern generator target in focus with a visual wavelength for alignment. This example takes away the focus repeatability limitations in the second example, but requires more time per wafer for alignment.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that only the Detailed Description section is meant to be used in interpreting claim limitations, and the Summary and Abstract sections are not to be used when interpreting the claim limitations. The Summary and Abstract sections are merely one or more exemplary embodiments or/examples of the present invention, while the Detailed Description provides additional/alternative embodiments and/or examples.

What is claimed is:

1. A system, comprising:
   an alignment system including an illumination portion and a detector, the illumination portion producing at least visible and infrared light;
   an object, including,
      a surface layer including a first feature pattern and a first alignment pattern,
      a support layer, and
      a second layer, which is located between the surface layer and the support layer,
      wherein at least one of the support layer and the second layer comprises a second feature pattern and a second alignment pattern; and
   a focusing system that co-focuses on the detector the at least visible and infrared light after each has impinged on at least one of the first and second alignment patterns,
   whereby the object is aligned to receive subsequent feature patterns based on the detected first and second alignment patterns.

2. The system of claim 1, wherein the focusing system comprises:
   an optical system positioned between the object and the detector, wherein the optical system performs the co-focusing of the at least visible and infrared light onto the detector.

3. The system of claim 2, wherein the focusing system further comprises:

a positioning system that receives a signal from the alignment system corresponding to a measured value and that moves at least one of the object and the detector relative to the optical system based on the measured value, such that the at least visible and infrared light are co-focused on the detector.

4. The system of claim 2, wherein the optical system comprises an optical element including at least first, second, and third lenses.

5. The system of claim 4, wherein:
the first lens comprises R1=−64 to −65 mm, R2=−71 to −72 mm, thickness=1.5 to 1.6 mm, diameter, =22.0 mm, and a glass type is SF10 (Schott);
the second lens comprises R1=−71 to −72 mm, R2=15 to 16 mm, thickness=1 to 2 mm, diameter=22.0 mm, and a glass type is N-PSK3 (Schott); and
the third lens comprises R1=15 to 16 mm, R2=−35 to −36 mm, thickness=10 to 11 mm, diameter=22.0 mm, and a glass type is N-PK51 (Schott).

6. The system of claim 5, wherein:
the first lens comprises R1=−64.795 mm, R2=−71.120 mm, thickness=1.518 mm, diameter, =22.0 mm, and a glass type is SF10 (Schott);
the second lens comprises R1=−71.120 mm, R2=15.469 mm, thickness=1.5 mm, diameter=22.0 mm, and a glass type is N-PSK3 (Schott); and
the third lens comprises R1=15.469 mm, R2=−35.382 mm, thickness=10.083 mm, diameter=22.0 mm, and a glass type is N-PK51 (Schott).

7. The system of claim 2, wherein the optical system comprises an optical element including at least first and second lenses.

8. The system of claim 7, wherein:
the first lens comprises R1=−26 to −27 mm, R2=infinity, thickness=3 mm, diameter=12 to 13 mm, and a glass type is BK7 (Schott);
the second lens comprises R1=infinity, R2=−59 to −60 mm, thickness=5 mm, diameter=12 to 13 mm, and a glass type is F2 (Schott).

9. The system of claim 8, wherein:
the first lens comprises R1=−26.697 mm, R2=infinity, thickness=3 mm, diameter=12.7 mm, and a glass type is BK7 (Schott);
the second lens comprises R1=infinity, R2=−59.03 mm, thickness=5 mm, diameter=12.7 mm, and a glass type is F2 (Schott).

10. The system of claim 1, wherein:
the visible light is used to detect a position of the first alignment pattern; and
the infrared is used to detect a position of the second alignment pattern.

11. The system of claim 1, wherein:
the visible light is reflected from the first alignment pattern before being focused onto the detector using the focusing system; and
the infrared light is transmitted through the second alignment pattern before being focused onto the detector using the focusing system.

12. The system of claim 1, wherein:
the infrared light is generated from a first side of the object; and
the visible light is generated from a second side of the object, opposite the first side.

13. A method, comprising:
(a) generating at least visible light and infrared light;
(b) impinging the visible light onto a first alignment pattern on a surface layer of an object;
(c) focusing the impinged visible light onto a detector;
(d) impinging the infrared light onto a second alignment pattern on a second layer of the object, the second layer of the object being below the first layer of the object;
(e) focusing the impinged infrared light onto the detector;
(f) generating an alignment signal based on the detected first and second alignment patterns; and
(g) aligning the object to receive a subsequent portion of a feature pattern based on step (f).

14. The method of claim 13, wherein the visible and IR light are focused onto the detector substantially simultaneously.

15. The method of claim 13, wherein:
the visible light is reflected from the first alignment pattern before being focused onto the detector; and
the infrared light is transmitted through the second alignment pattern before being focused onto the detector.

16. The method of claim 13, wherein:
the infrared light is generated from a first side of the object; and
the visible light is generated from a second side of the object, opposite the first side.

17. A flat panel display formed using the method of claim 13.

18. An integrated circuit formed using the method of claim 13.

* * * * *